(12) United States Patent
Daves et al.

(10) Patent No.: US 10,180,370 B2
(45) Date of Patent: Jan. 15, 2019

(54) PRESSURE SENSOR AND METHOD FOR PRODUCING THE PRESSURE SENSOR

(71) Applicant: Robert Bosch GmbH, Stuttgart (DE)

(72) Inventors: Walter Daves, Singapore (SG); Michael Badeja, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 161 days.

(21) Appl. No.: 15/125,967

(22) PCT Filed: Feb. 2, 2015

(86) PCT No.: PCT/EP2015/052054
§ 371 (c)(1),
(2) Date: Sep. 13, 2016

(87) PCT Pub. No.: WO2015/135691
PCT Pub. Date: Sep. 17, 2015

(65) Prior Publication Data
US 2017/0097270 A1    Apr. 6, 2017

(30) Foreign Application Priority Data
Mar. 13, 2014 (DE) .................. 10 2014 204 664

(51) Int. Cl.
*H01L 41/113* (2006.01)
*G01L 9/00* (2006.01)
*B81C 1/00* (2006.01)
*B81B 3/00* (2006.01)

(52) U.S. Cl.
CPC .......... *G01L 9/0045* (2013.01); *B81B 3/0097* (2013.01); *B81C 1/00158* (2013.01);
(Continued)

(58) Field of Classification Search
CPC .. H01L 29/84; H01L 41/1132; H01L 41/1138; B81B 3/0097; B81B 7/008;
(Continued)

(56) References Cited

U.S. PATENT DOCUMENTS 6,647,796 B2    11/2003  Beach et al.
6,928,878 B1 *   8/2005  Eriksen ................. G01L 9/0042
                                                                73/724

FOREIGN PATENT DOCUMENTS

DE     10 2004 043 357 A1    3/2006
DE     10 2006 007 729 A1    8/2007
JP            4-87376 A      3/1992
JP           4-305131 A     10/1992
JP           4-317378 A     11/1992
(Continued)

OTHER PUBLICATIONS

International Search Report corresponding to PCT Application No. PCT/EP2015/052054, dated Apr. 15, 2015 (German and English language document) (7 pages).
(Continued)

*Primary Examiner* — Stephen W Smoot
(74) *Attorney, Agent, or Firm* — Maginot, Moore & Beck LLP

(57) ABSTRACT

A pressure sensor has a substrate and a transistor structure. The substrate has a cavity formed in the substrate. The transistor structure is arranged above the cavity. The transistor structure has a flexible heterostructure and at least one source contact, drain contact, and gate contact each connected to the heterostructure in an electrically conductive manner. The heterostructure is configured to assume a position corresponding to a pressure ratio between a first pressure in the cavity and a second pressure on a side of the heterostructure opposite the cavity. The transistor structure is configured to provide an electrical signal corresponding to the position.

15 Claims, 2 Drawing Sheets

(52) U.S. Cl.
CPC ...... *B81C 1/00246* (2013.01); *H01L 41/1138* (2013.01); *B81B 2201/0264* (2013.01); *B81B 2203/0127* (2013.01); *B81B 2207/015* (2013.01); *B81C 2203/0771* (2013.01)

(58) Field of Classification Search
CPC .... B81B 2201/0264; B81B 2203/0127; B81B 2203/0315; B81B 2203/053; B81B 2207/015; B81C 1/00158; B81C 1/00182; B81C 1/00246; B81C 1/0038; B81C 2201/0177; B81C 2203/0714; B81C 2203/0735; B81C 2203/0771; G01L 9/0045

See application file for complete search history.

(56) References Cited

FOREIGN PATENT DOCUMENTS

| | | |
|---|---|---|
| JP | 8-162646 A | 6/1996 |
| JP | 2005-144571 A | 6/2005 |
| JP | 2006-75982 A | 3/2006 |
| WO | 2012/163783 A1 | 12/2012 |

OTHER PUBLICATIONS

G. Lammel et. al, Next Generation Pressure Sensors in Surface Micromachining Technology, The 13th International Conference on Solid-State Sensors, Actuators and Microsystems, 2005: Digest of Technical Papers. Transducers '05: vol. 1, Jan. 1, 2005, pp. 35-36, XP055180708.

\* cited by examiner

PRESSURE SENSOR AND METHOD FOR PRODUCING THE PRESSURE SENSOR

This application is a 35 U.S.C. § 371 National Stage Application of PCT/EP2015/052054, filed on Feb. 2, 2015, which claims the benefit of priority to Serial No. DE 10 2014 204 664.5, filed on Mar. 13, 2014 in Germany, the disclosures of which are incorporated herein by reference in their entirety.

BACKGROUND

The present disclosure relates to a pressure sensor and to a method for producing the pressure sensor.

A pressure sensor requires a pressure-sensitive membrane that separates two pressures from each other. The membrane is deflected in a way corresponding to a pressure difference across the membrane. The deflection of the membrane is converted into an electrical signal.

U.S. Pat. No. 6,647,796 B2 describes a semiconductor nitride pressure microsensor and a method for producing the pressure microsensor.

SUMMARY

Against this background, the approach that is set out here presents a method for producing a pressure sensor, a pressure sensor and an apparatus that uses the method as well as finally a corresponding computer program product. Advantageous refinements are provided by the respective subclaims and the description that follows.

In order to produce a chamber or a hollow space, a placeholder may be arranged in a clearance. The placeholder may serve as a structural element for supporting a closing layer when closing the clearance. When the clearance is closed, the placeholder can be removed and the hollow space is created. In particular, a material of the placeholder may displace more volume in a first state than in a second state. To remove the placeholder, the material can be transformed from the first state into the second state. A volume shrinkage forms the volume of the chamber.

The clearance can advantageously be closed by the placeholder inexpensively by simple means. The resulting pressure sensor can have a high degree of sensitivity since a pressure-sensitive membrane of a high quality can be produced by the approach set out here.

A method for producing a pressure sensor is presented, the method comprising the following steps:
  providing a substrate for the pressure sensor;
  modifying the substrate in a partial region of the substrate that is intended for a cavity of the pressure sensor, in order to obtain a modified substrate;
  depositing a heterostructure on a surface of the substrate in the region of the modified substrate;
  removing the modified substrate, in order to produce the cavity between the heterostructure and the substrate; and
  contacting the heterostructure with at least one source contact, drain contact and gate contact, in order to produce a transistor structure of the pressure sensor.

A pressure sensor with the following features is also presented:
  a substrate with a cavity introduced into the substrate; and
  a transistor structure, which is arranged over the cavity, the transistor structure having a flexible heterostructure and at least one source contact and drain contact as well as a gate contact that are connected to the heterostructure in an electrically conducting manner, the heterostructure being designed to assume a position corresponding to a pressure ratio between a first pressure in the cavity and a second pressure on a side of the heterostructure that is opposite from the cavity, and the transistor structure being designed to provide an electrical signal corresponding to the position.

A further embodiment envisages reading out the 2D electron gas purely resistively without the gate contact, by means of the source contact and the drain contact.

A pressure sensor may be understood as meaning a sensor for detecting a pressure in a medium. In this case, the pressure may be a static pressure or a dynamic pressure. For detecting the pressure, a displacement of a membrane is detected. The displacement is dependent on a moment of resistance to bending of the membrane and a force acting on the membrane. The moment of resistance to bending is dependent on a thickness of the membrane and material characteristics of the membrane. The force acting on the membrane is dependent on a surface area of the membrane and a pressure difference between a first pressure on a first side of the membrane and a second pressure on a second side of the membrane. If the pressure sensor is an absolute pressure sensor, the pressure on one side of the membrane is a known pressure, with which the pressure on the other side of the membrane is compared. A pressure difference between the known pressure and the unknown pressure results in the force acting on the membrane. For this purpose, the pressure sensor has alongside the membrane a chamber or cavity, in which the known pressure prevails. If the pressure sensor is a differential pressure sensor, the pressures on the two sides of the membrane are unknown, but the pressure difference between the two pressures results in the force acting on the membrane. A substrate may be a starting material for the pressure sensor. The substrate may be a semiconductor substrate. In particular, the substrate may be silicon. During the modification, a structure of the substrate may be modified. The membrane may have at least one heterostructure. The heterostructure may be made up of at least two different layers of material. The source contact, the drain contact and the gate contact may be electrically conducting terminals, which are in direct or indirect contact with the heterostructure. The source contact, the drain contact and the gate contact make the heterostructure into a transistor structure.

The method may comprise a step of growing a carrier layer for the heterostructure on the modified substrate. A carrier layer may consist of a semiconductor material. The carrier layer may consist of the same material as the substrate. The carrier layer may become a constituent part of the substrate. The carrier layer allows the flexural rigidity of the membrane to be influenced. A thicker membrane allows greater forces to be withstood. A thinner membrane may have a higher degree of sensitivity. The carrier layer can improve an impermeability of the cavity.

The method may comprise a step of introducing an electrical circuit into the substrate, the electrical circuit being electrically connected to the transistor structure. The circuit may be a microelectronic circuit. The circuit may be produced by using production steps from semiconductor technology. The circuit may be arranged at a small distance from the transistor structure. The small distance allows the circuit to use pressure signals with a very small amplitude.

The method may comprise a step of opening the cavity, the substrate being broken through to create a differential pressure sensor. The substrate may be broken through on a side opposite from the membrane. Then the pressure sensor can be arranged between a first volume and a second volume, in order to detect a differential pressure between a first pressure in the first volume and a second pressure in the second volume.

In the contacting step, an insulating layer may be arranged between the heterostructure and the gate contact. An insulating layer allows an electrical conductivity of the heterostructure to be influenced by using an electrical field of the gate electrode. The insulating layer has the effect of preventing a flow of current between the heterostructure and the gate electrode.

In the modifying step, the modified substrate may be modified by anodizing, the anodizing particularly causing the substrate to become porous. During the anodizing, the substrate may be modified by using electrical energy. A porous substrate may have a lower density than the substrate.

In the depositing step, at least two semiconductor materials with band gaps of different sizes may be deposited one on top of the other, in order to produce the heterostructure. The band gaps of different sizes allow an electron gas to be produced between the semiconductor materials. In the electron gas, electrons can be moved with little resistance in the direction of a plane of the layers. Transversely to the plane of the layers, the electrons can be moved with great resistance. The electron gas allows a pressure sensor with a particularly high degree of sensitivity to be produced. The semiconductor heterostructure may consist of a sequence of two compound semiconductors from the elements of the III-V groups. The heterostructure may for example be formed by the sequence GaN/AlGaN.

Also favorable is an embodiment of the approach set out here comprising a step of thinning the heterostructure to a predetermined thickness, in particular with the thinning taking place by using chemical-mechanical polishing. With an already pre-structured substrate, a cavity with a carrier layer and an absolute pressure sensor can be created here by a subsequent process of bringing together under reference conditions, for example a fixed pressure. Such an embodiment of the approach set out here offers the advantage of a particularly simple and inexpensive possibility for production.

In the removing step, the modified substrate may be broken up by a heat treatment. The heat treatment allows the modified substrate to melt. During the melting, the material of the modified substrate can assume a surface area that is as small as possible. In this case, a volume of the modified substrate can shrink. The shrinkage allows the cavity to be created. In the cavity, something of a vacuum can be created.

The approach set out here also provides an apparatus which is designed to carry out or implement the steps of a variant of a method presented here in corresponding devices. This configurational variant of the disclosure in the form of an apparatus also allows the object on which the disclosure is based to be achieved quickly and efficiently.

In the present case, an apparatus may be understood as meaning an electrical unit that processes sensor signals and, in dependence on them, outputs control and/or data signals. The apparatus may have an interface, which may take the form of hardware and/or software. Taking the form of hardware, the interfaces may for example be part of a so-called system ASIC, which comprises a wide variety of functions of the apparatus. It is also possible however that the interfaces are dedicated integrated circuits or at least partially consist of discrete components. Taking the form of software, the interfaces may be software modules, which are for example present on a microcontroller along with other software modules.

Also of advantage is a computer program product or computer program with a program code, which may be stored on a machine-readable carrier or storage medium such as a semiconductor memory, a hard drive memory or an optical storage medium and is used for carrying out, implementing and/or activating the steps of the method according to one of the embodiments described above, in particular when the program product or program is run on a computer or an apparatus.

BRIEF DESCRIPTION OF THE DRAWINGS

The approach set out here is explained in more detail below by way of example on the basis of the accompanying drawings, in which.

DETAILED DESCRIPTION

In the description that follows of favorable exemplary embodiments of the present disclosure, the same or similar designations are used for the elements that are presented in the various figures and act in a similar way, without the description of these elements being repeated.

Figure 1:
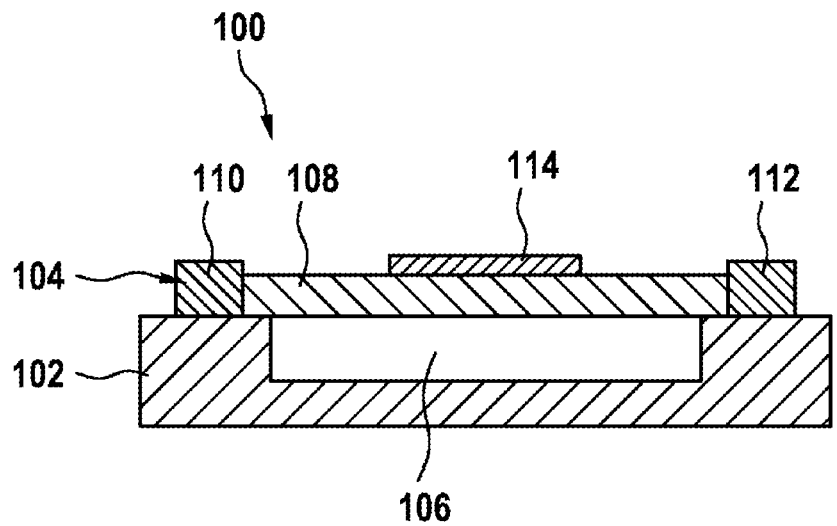
FIG. 1 shows a representation of a pressure sensor according to an exemplary embodiment of the present disclosure.

FIG. 1 shows a representation of a pressure sensor 100 according to an exemplary embodiment of the present disclosure. The pressure sensor 100 has a substrate 102 and a transistor structure 104. A cavity 106 has been introduced into the substrate 102. Arranged over the cavity 106 is the transistor structure 104. The transistor structure 104 closes the cavity 106. The transistor structure 104 has a flexible heterostructure 108 and at least one source contact 110 or a source electrode 110, at least one drain contact 112 or a drain electrode 112 and at least one gate contact 114 or a gate electrode 114. The heterostructure 108 is formed as a flexible membrane that closes the cavity 106 in a fluid-tight manner. The source contact 110 is connected in an electrically conducting manner to a first side of the heterostructure 108. The drain contact 112 is connected in an electrically conducting manner to a second side of the heterostructure 108 that is opposite from the first side. The gate contact 114 is arranged on a side of the heterostructure 108 that is opposite from the cavity. The heterostructure 108 is designed to assume a position corresponding to a pressure ratio between a first pressure in the cavity 106 and a second pressure on the opposite side of the heterostructure 108. The transistor structure 104 is designed to provide an electrical signal corresponding to the position.

The cavity 106 was produced during the production of the pressure sensor 100 by a transformation of material of the substrate 102 into a modified substrate and a subsequent removal of the modified substrate. Before the removal of the modified substrate, the heterostructure 108 was deposited on the surface of the substrate 102 and of the modified substrate. After an at least partial buildup of the heterostructure 108, the modified substrate was removed.

In an exemplary embodiment, the material of the substrate 102 consists of silicon and was modified by anodizing, so that the material became porous. The porous material is less heat-resistant than the original material of the substrate 102. During a heat treatment, in which the heterostructure 108 is built up, the porous material was broken up and drawn together, in order to form a surface area that is as small as possible. The cavity 106 was left behind as a hollow space. Since the heterostructure 108 and also the substrate 102 are fluid-tight, something of a vacuum is formed within the cavity 106.

The pressure sensor 100 is designed to provide an electrical signal, which represents a difference between the pressure within the cavity 106 and a pressure on the opposite side of the heterostructure 108. On the basis of the pressure difference on the two sides of the heterostructure, a resultant force acts on the heterostructure 108. The force bends the heterostructure 108 or the membrane. The bending has the effect of changing an electrical conductivity of the heterostructure 108. The electrical signal represents the changed electrical conductivity.

In an exemplary embodiment, the pressure sensor 100 has an electrical circuit. The circuit was introduced into the substrate 102 during production. The circuit may be attached to the front side or the rear side of the substrate by appropriate methods from semiconductor technology. The electrical circuit is electrically connected to the transistor structure 104. The circuit is designed to process or boost the electrical signal of the transistor structure 104.

In an exemplary embodiment, the pressure sensor 100 has an open cavity. The substrate 102 is broken through with respect to the membrane. The opening to the cavity turns the pressure sensor 100 into a differential pressure sensor.

In a specific embodiment, FIG. 1 shows a GaN-HEMT pressure sensor 100 according to the approach set out here. The pressure sensor 100 has as a pressure-sensitive part a III/V heterostructure 108 without a supporting substrate. The heterostructure 108 is a constituent part of a transistor 104.

Figure 2:
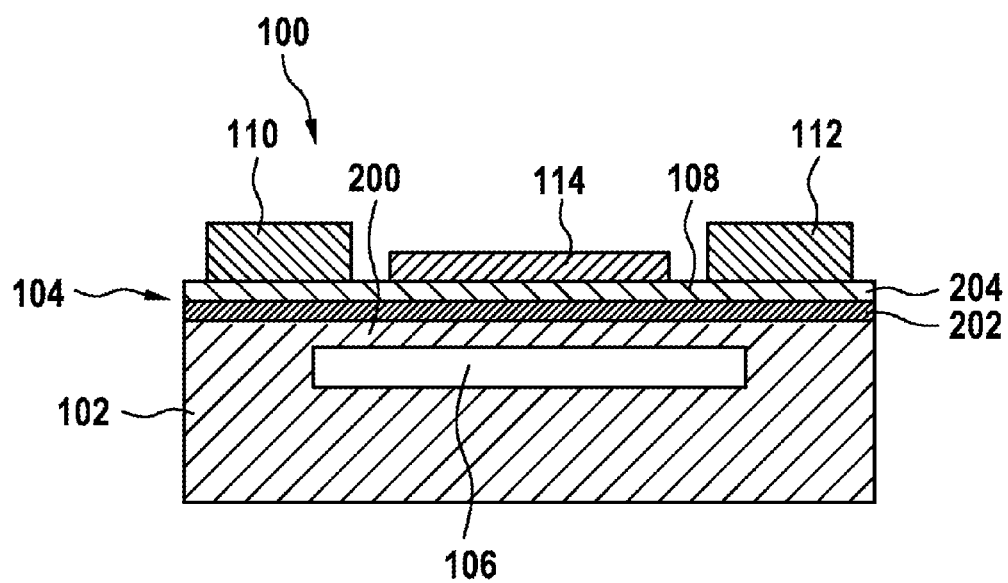
FIG. 2 shows a representation of a pressure sensor with a carrier layer according to an exemplary embodiment of the present disclosure.

FIG. 2 shows a representation of a pressure sensor 100 with a carrier layer 200 according to an exemplary embodiment of the present disclosure. The pressure sensor 100 corresponds substantially to the pressure sensor in FIG. 1. In addition, the pressure sensor 100 has the carrier layer 200 between the heterostructure 108 and the cavity 106. The carrier layer 200 is fixedly connected to the heterostructure 108. The carrier layer 200 is consequently an integral constituent part of the membrane closing the cavity 106. The carrier layer 200 was grown on the surface of the substrate 102 and of the modified substrate during the production of the pressure sensor 100. The carrier layer 200 is consequently likewise part of the substrate 102. The carrier layer 200 therefore encloses the modified substrate. During the further production process, the modified substrate breaks up and forms the cavity 106. The carrier layer promotes the deposition of the heterostructure 108 and consists for example of epitaxially grown silicon. A thickness of the carrier layer 200 decisively determines the bending resistance of the heterostructure 108. The thicker the membrane comprising the carrier layer 200 and the heterostructure 108 is, the more flexurally rigid it is. The more flexurally rigid the membrane is, the smaller a deflection of the membrane is under the same pressure difference. In other words, a sensitivity of the pressure sensor 100 becomes greater the thinner the membrane is.

A further embodiment provides that the heterostructure 108 is grown in a separate process onto a carrier layer 200 or substrate, which is brought as necessary to a required thickness, for example by CMP (chemical-mechanical polishing). By a process of bringing together, for example by the method of direct bonding of an already pre-structured substrate 102, a cavity 106 with a carrier layer 200 is created in a way corresponding to FIG. 2. This configuration offers a great advantage in terms of being able to produce large numbers.

In the depositing step, two semiconductor layers with band gaps of different sizes can be deposited one on top of the other, in order to produce the heterostructure.

In this exemplary embodiment, the heterostructure 108 is made up of two layers 202, 204 of different semiconductor materials. The at least two semiconductor materials have band gaps of different sizes. Formed between the layers 202, 204 is a two-dimensional electron gas, which has a great electrical conductivity in a direction of extent of the layers 202, 204. In order to promote the process of growth of the layers 202 and 204, an additional transition layer or buffer layer may be used. Choosing a suitable transition layer allows the layers 202 and 204 to be grown heteroepitaxially on the carrier layer 200.

The layers 202, 204 were deposited on the surface of the substrate 102 or the carrier layer 200 over a large surface area. The source contact 110 and the drain contact 112 are electrically connected along the heterostructure by deposition and use of a thermal process with the electron gas.

The HEMT transistor 104 (High-Electron Mobility Transistor) is a special type of field-effect transistor which is characterized by a conductive channel with a high charge carrier mobility. The structure of the HEMT transistor 104 consists of layers 202, 204 of different semiconductor materials with band gaps of different sizes, which form a heterostructure 108. Coming into consideration for this in particular are compound semiconductors that consist of elements of the III/V group of the periodic table. For example, the material system GaN/AlGaN may be used. If these two materials are deposited one on top of the other, a two-dimensional electron gas (2DEG) forms at the interface of these materials on the two sides of the GaN, and may serve as a conductive channel, since the electron mobility at typically 2000 $cm^2$/Vs therein is very high. The production of the electron gas is caused by a superposing of the spontaneous polarizations in the GaN and AlGaN layers 202, 204 with the piezoelectric polarization in the AlGaN layer caused by mechanical stress. Thanks to the high electrical electron mobility, this material system is particularly suitable for power-electronic applications; in addition, the property of the electron gas likewise makes it possible to produce a highly sensitive pressure sensor 100.

To realize an absolute pressure sensor 100, for example on a GaN/AlGaN basis, it has a defined cavity 106 with reference pressure and a corresponding membrane 108.

The approach set out here makes it possible to dispense with a wet-chemical or dry-chemical etching process in the production of the membrane 108. It also provides the advantage of being able to dispense with a complicated sequence of differently doped GaN layers. It is possible by the approach set out here to use less expensive and technologically more refined, simple GaN/AlGaN heterostructures 108.

An absolute pressure sensor 100 that is based on a III/V heterostructure 108 is presented. The production is based on a method for producing a membrane 108 by means of porous silicon that allows use of the standard buildup of GaN/AlGaN heterostructures 108 from microwave technology or power electronics.

In other words, FIG. 2 shows a cross section of a pressure sensor 100 according to an exemplary embodiment of the present disclosure, based on a III/V heterostructure 108. The heterostructure 108 is turned into a transistor structure 104 by two ohmic contacts 110, 112 and an HEMT gate 114. The first layer 202 of the heterostructure 108 consists of GaN or gallium nitride. The second layer 204 of the heterostructure 108 consists of AlGaN or aluminum gallium nitride. The substrate 102 consists of silicon (111).

Figure 3:
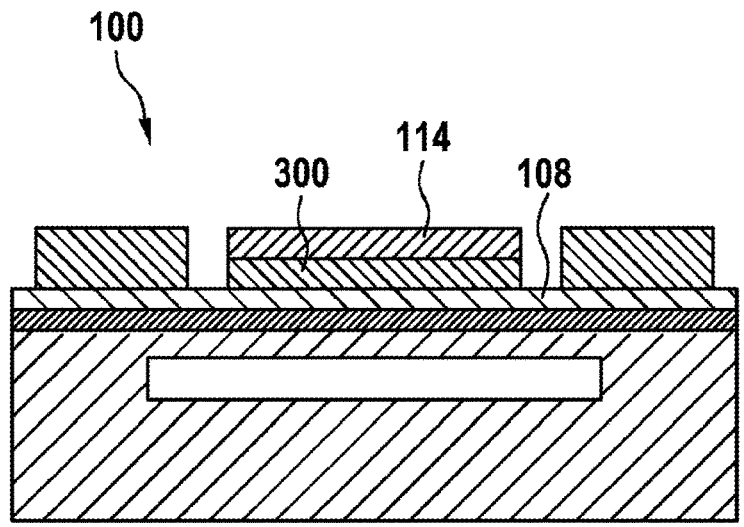
FIG. 3 shows a representation of a pressure sensor with an insulating layer according to an exemplary embodiment of the present disclosure.

FIG. 3 shows a representation of a pressure sensor 100 with an insulating layer 300 according to an exemplary embodiment of the present disclosure. The pressure sensor 100 corresponds substantially to the pressure sensor in FIG. 2. In addition, the insulating layer 300 is arranged between the heterostructure 108 and the gate electrode 114 or the gate contact 114. The insulating layer 300 insulates the gate electrode 114 electrically from the heterostructure 108.

In other words, FIG. 3 shows a cross section of a pressure sensor 100 according to an exemplary embodiment of the present disclosure, on the basis of a III/V heterostructure 108. The heterostructure 108 is turned into a transistor structure 104 by two ohmic contacts 110, 112 and a MISFET gate 114 with an insulator 300. The first layer 202 of the heterostructure 108 consists of GaN or gallium nitride. The second layer 204 of the heterostructure 108 consists of AlGaN or aluminum gallium nitride. The substrate 102 consists of silicon (111).

Figure 4:
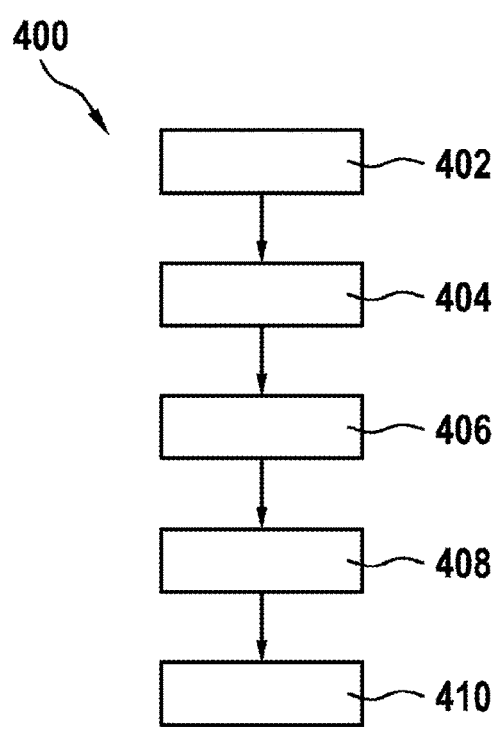
FIG. 4 shows a flow diagram of a method for producing a pressure sensor according to an exemplary embodiment of the present disclosure.

FIG. 4 shows a flow diagram of a method 400 for producing a pressure sensor according to an exemplary embodiment of the present disclosure. The method 400 comprises a providing step 402, a modifying step 404, a depositing step 406, a removing step 408 and a contacting step 410. In the providing step 402, a substrate for the pressure sensor is provided. In the modifying step 404, the substrate is modified in a partial region of the substrate intended for a cavity of the pressure sensor, in order to obtain a modified substrate. In the depositing step 406, a heterostructure is deposited on a surface of the substrate in the region of the modified substrate. In the removing step 408, the modified substrate is removed, in order to produce the cavity between the heterostructure and the substrate. In the contacting step 410, the heterostructure is provided with at least one source contact, drain contact and gate contact, in order to produce a transistor structure of the pressure sensor.

Before the depositing step 406, a growing step may be performed. In it, a carrier layer for the heterostructure is grown on the modified substrate and/or the surface of the substrate.

A cavity under a GaN/AlGaN heterostructure may be realized by the method 400 described here. For this purpose, a <111> substrate is used. In it, porous silicon is generated by anodizing in the regions where the cavity/cavities is/are to be created.

After that, an HEMT structure is produced by a process of MOCVD growth. For this purpose, a low-temperature AlN seed layer or aluminum-nitride seed layer with for example approximately ten nanometers to 1000 nm is applied at 400° C. to 800° C. This is followed by a process of in-situ annealing or thermal treatment at over 1000° C., in which the porous Si breaks up. The cavity is created where previously porous silicon was generated. On the seed layer, a GaN/AlGaN heterostructure is grown at the conventional MOCVD temperatures of 1000° C. to 1200° C.

The HEMT component production is then performed by an interdevice isolation, for example by means of implantation or mesa etching. A gate terminal is produced by a Schottky contact or an MIS contact. Ohmic contacts, metalizations and passivations supplement the HEMT structure.

Alternatively, a thin Si epitaxy, in particular smaller than one micrometer to a few μm, may be carried out before the MOCVD epitaxy.

A trench may be created from the rear side, so that the sensor can be used as a differential pressure sensor. In this case, the substrate may be thinned to make this process step easier.

In a further embodiment, electronic circuits are realized directly in the vicinity of the pressure sensor; this allows for example additional functions such as signal processing or signal boosting to be monolithically integrated.

A pressure range of the pressure sensor presented here can be set by a suitable choice of the grown GaN/AlGaN layer or Si epitaxy layer. As a result of the very good electrical properties of GaN/AlGaN HEMTs, the pressure sensor has a high degree of sensitivity.

Using the porous silicon as a placeholder for the cavity makes it simple to conduct the process.

A pressure sensor produced in this way has a high resistance to harsh ambient conditions. The high chemical inertness of the GaN/AlGaN layers allows the sensor also to be operated in harsh ambient conditions, such as for example at high temperatures or in a corrosive atmosphere. This is advantageous in particular for automotive applications.

A level of quality of the production process can be checked by known methods, such as SEM, FIB, TEM and XPS. These allow good recognition of the active heterostructure layer and the cavity.

According to the approach set out here, the sensor may be used for example as an absolute pressure sensor and/or as a differential pressure sensor in the area of entertainment electronics and automobile electronics. In particular, the sensor can be used in applications that require a high degree of sensitivity along with a high level of robustness, such as for example combustion chamber pressure sensors.

The exemplary embodiments described and shown in the figures are chosen merely by way of example. Different exemplary embodiments may be combined with one another completely or with respect to individual features. One exemplary embodiment may also be supplemented by features of another exemplary embodiment.

Furthermore, the method steps presented here may be repeated and carried out in a sequence other than that described.

If an exemplary embodiment comprises an "and/or" conjunction between a first feature and a second feature, this should be read as meaning that, according to one embodiment, the exemplary embodiment comprises both the first feature and the second feature and, according to a further embodiment, the exemplary embodiment comprises either only the first feature or only the second feature.

The invention claimed is:

1. A method for producing a pressure sensor, the method comprising:
    modifying a substrate for the pressure sensor in a partial region of the substrate that is to be configured for a cavity of the pressure sensor so as to obtain a modified substrate;
    depositing a heterostructure on a surface of the substrate in the region of the modified substrate;
    removing the modified substrate in the partial region of the substrate to produce the cavity between the heterostructure and the substrate; and contacting the heterostructure with at least one source contact, drain contact, and gate contact so as to produce a transistor structure of the pressure sensor.

2. The method as claimed in claim 1, further comprising growing a carrier layer for the heterostructure on the modified substrate.

3. The method as claimed in claim 1, further comprising introducing an electrical circuit into the substrate, the electrical circuit being electrically connected to the transistor structure.

4. The method as claimed in claim 1, further comprising opening the cavity, the substrate being broken through to create a differential pressure sensor.

5. The method as claimed in claim 1, wherein contacting the heterostructure includes arranging an insulating layer between the heterostructure and the gate contact.

6. The method as claimed in claim 1, wherein modifying a substrate includes modifying the modified substrate by anodizing.

7. The method as claimed in claim 6, wherein the anodizing causes the substrate to become porous.

8. The method as claimed in claim 1, wherein depositing a heterostructure includes depositing at least two semiconductor materials with band gaps of different sizes one on top of the other so as to produce the heterostructure.

9. The method as claimed in claim 1, further comprising thinning the heterostructure to a predetermined thickness.

10. The method as claimed in claim 9, wherein the thinning takes place by using chemical-mechanical polishing.

11. The method as claimed in claim 1, wherein removing the modified substrate includes breaking up the modified substrate by a heat treatment.

12. A pressure sensor, comprising:
   a substrate with a cavity defined in the substrate, the cavity formed by melting a portion of the substrate which has been modified by creating pores in the portion of the substrate; and
   a transistor structure arranged over the cavity, the transistor structure having a flexible heterostructure and at least one source contact, drain contact, and gate contact that are each connected to the heterostructure in an electrically conducting manner,
   wherein the heterostructure is configured to assume a position corresponding to a pressure ratio between a first pressure in the cavity and a second pressure on a side of the heterostructure that is opposite from the cavity, the transistor structure configured to provide an electrical signal corresponding to the position.

13. An apparatus configured to one or more of carry out and-implement a method for producing a pressure sensor, the method including:
   modifying a substrate for the pressure sensor in a partial region of the substrate that is to be configured for a cavity of the pressure sensor so as to obtain a modified substrate;
   depositing a heterostructure on a surface of the substrate in the region of the modified substrate;
   removing the modified substrate in the partial region of the substrate to produce the cavity between the heterostructure and the substrate; and
   contacting the heterostructure with at least one source contact, drain contact, and gate contact so as to produce a transistor structure of the pressure sensor.

14. The apparatus as claimed in claim 13, wherein the apparatus includes a non-transitory computer program configured to one or more of activate and implement the method for producing the pressure sensor.

15. The apparatus as claimed in claim 14, wherein the computer program is stored on a non-transitory machine readable storage medium.

* * * * *